United States Patent [19]
Gourgue

[11] Patent Number: 5,619,536
[45] Date of Patent: Apr. 8, 1997

[54] DIGITAL SUPERHETERODYNE RECEIVER AND BASEBAND FILTER METHOD USED THEREIN

[75] Inventor: Frédéric Gourgue, Paris, France

[73] Assignee: Alcatel Radiotelephone, Paris, France

[21] Appl. No.: 212,730

[22] Filed: Mar. 14, 1994

[30] Foreign Application Priority Data

Mar. 15, 1993 [FR] France .................................. 93 02948

[51] Int. Cl.⁶ ..................................................... H04L 27/06
[52] U.S. Cl. ........................... 375/316; 375/244; 375/350; 341/143
[58] Field of Search ................................ 375/75, 28, 103; 341/143; 455/324

[56] References Cited

U.S. PATENT DOCUMENTS

| | | | |
|---|---|---|---|
| 4,939,516 | 10/1993 | Early | 375/28 |
| 5,302,950 | 4/1994 | Johnson et al. | 341/123 |
| 5,329,282 | 7/1994 | Jackson | 341/143 |
| 5,341,135 | 8/1994 | Pearce | 341/143 |

FOREIGN PATENT DOCUMENTS

WO8701531  3/1987  WIPO.

OTHER PUBLICATIONS

Sangil Park et al, "A Digital AM Radio With CQUAM Stereo", *Globecom '92 Conference Record*, vol. 1, Dec. 6, 1992, pp. 457–461.

French Search Report FR 9302948.

*Primary Examiner*—Tesfaldet Bocure
*Assistant Examiner*—T. Ghebretinsae
*Attorney, Agent, or Firm*—Sughrue, Mion, Zinn, Macpeak & Seas

[57] ABSTRACT

A digital receiver includes an antenna for picking up signals, a converter for converting an incoming signal to a predetermined intermediate frequency, and baseband processor. The receiver further includes an analog/digital converter using oversampling relative to the bandwidth of the signal and receiving the intermediate frequency signal at its input, and decimation filters receiving the output signal from the analog/digital converter and having their outputs connected to the baseband processor.

9 Claims, 2 Drawing Sheets

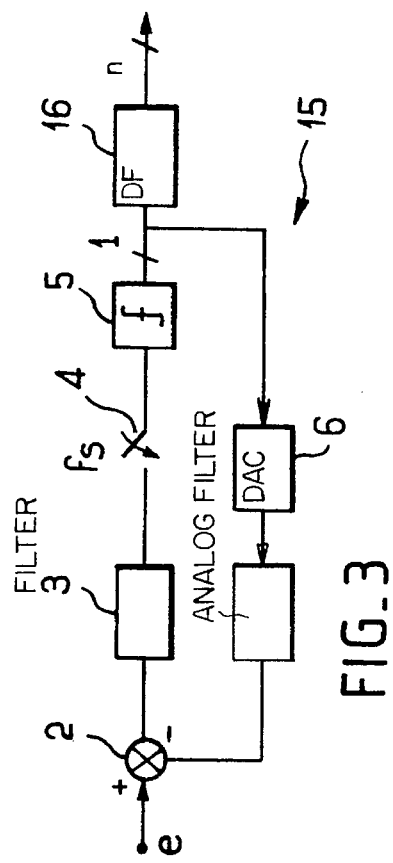
FIG_1
PRIOR ART
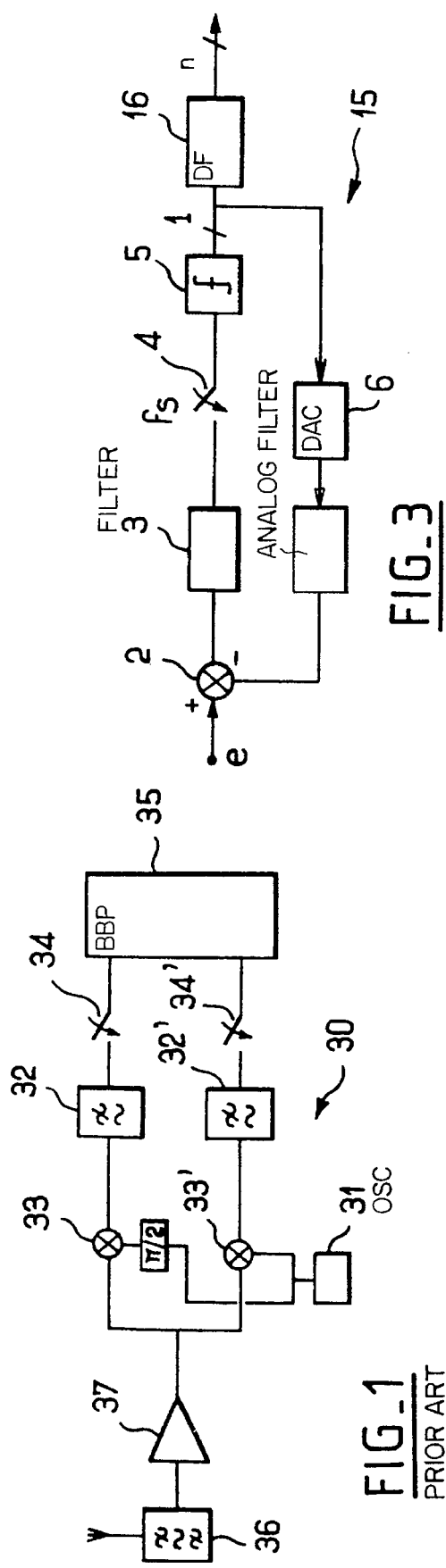
FIG_2
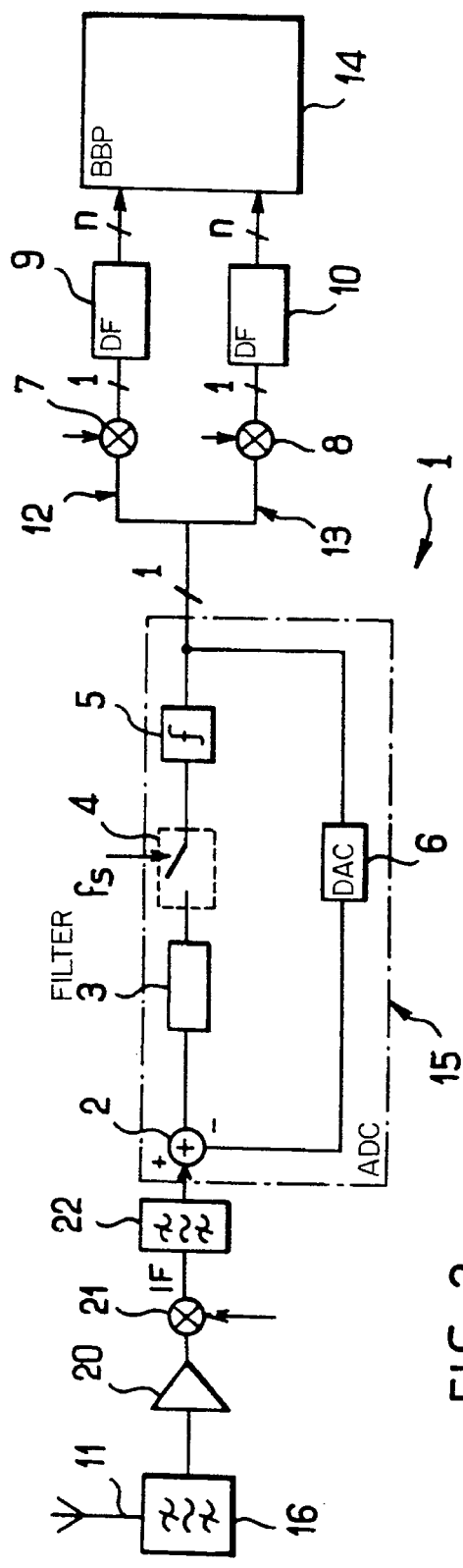
FIG_3

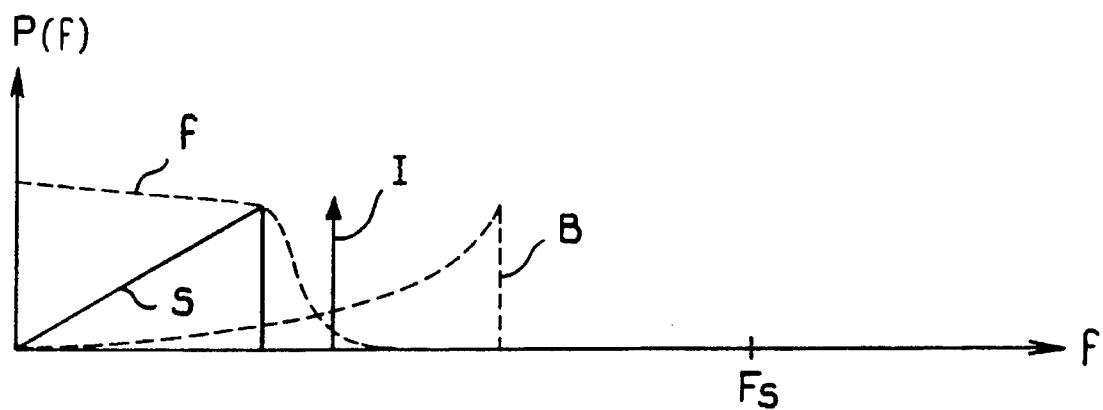
FIG_4
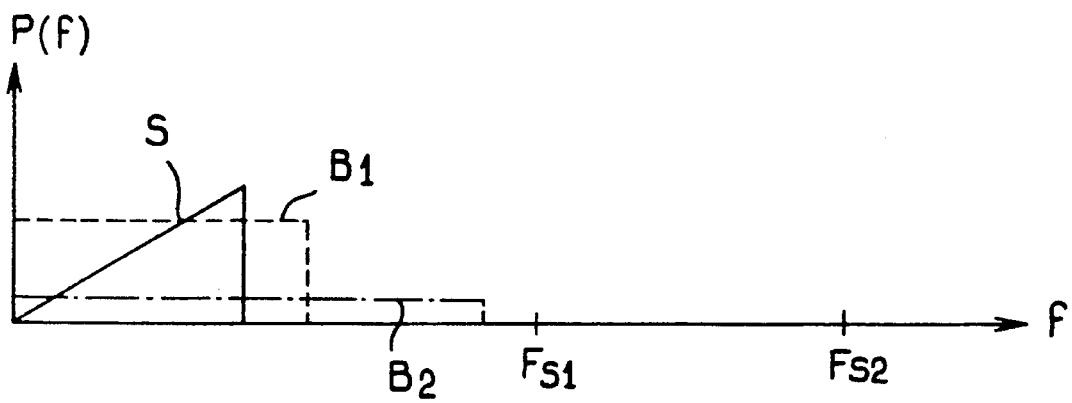
FIG_5

DIGITAL SUPERHETERODYNE RECEIVER AND BASEBAND FILTER METHOD USED THEREIN

BACKGROUND OF THE INVENTION

The present invention concerns a digital superheterodyne receiver.

It also concerns a baseband filtering method used therein.

Current digital receivers have to extract information on in-phase and quadrature channels after the signal is transposed into the baseband. This is generally achieved using two mixers receiving:
an input signal, and
a signal from a local oscillator for the in-phase channel and the same signal phase-shifted by $\pi/2$ for the quadrature channel.

The output signal of each mixer has to be filtered (in the analog domain) after which it undergoes analog/digital conversion and then processing in the baseband.

Referring to FIG. 1, for example, a receiver device 30 usually comprises at the input end a first bandpass filter 36, a low-noise amplifier 37 and two channels each comprising a mixer 33, 33', a filter 32, 32' and a sampler 34, 34'. The mixer 33 is connected to a local oscillator via a $\pi/2$ phase-shifter and the mixer 33' is connected direct to the same oscillator. The respective outputs of the two samplers 34, 34' then undergo digital baseband processing (35). In this type of device the channel filtering is effected at the filters 32, 32' which are implemented in analog technology and whose fixed characteristics strongly condition the overall performance of the receiver and the degree of protection against interference.

This type of processing accordingly has drawbacks in terms of accuracy, drift and adaptation to different channels and different bit rates.

SUMMARY OF THE INVENTION

An object of the invention is to remedy these drawbacks by proposing a digital superheterodyne receiver with improved accuracy, freedom from drift and adaptivity such that its characteristics can be adjusted according to different needs, for example to adapt to different types of modulation or different bandwidths to eliminate a scrambler, or to apply pre-filtering or adaptive filtering for equalization.

According to the invention the receiver comprising antenna means for picking up signals, means for converting an incoming signal to a predetermined intermediate frequency and baseband processing means is characterized in that it further comprises analog/digital converter means which receive at an input said intermediate frequency signal to process it using oversampling relative to the baseband signal bandwidth and decimation filter means receiving at an input the converted signal and having its output connected to the baseband processing means.

Thus in a digital receiver according to the invention some filter functions previously carried out on analog signals are transferred into the digital part. Out-band noise is eliminated by the decimation filter which can additionally implement other filter functions. Also, the proposed conversion process is easily implemented in an integrated circuit. Further, the receiver according to the invention has an adaptable signal bandwidth.

In an advantageous embodiment of a receiver according to the invention the receiver further comprises at the output of the oversampling analog/digital converter means two channels each comprising decimation filter means connected to the baseband processing means.

In another aspect, the invention proposes a method for digital filtering in the baseband of an input signal previously converted to a predetermined intermediate frequency characterized in that it comprises an analog/digital conversion stage using a sampling frequency greater than twice the bandwidth of the input signal (oversampling) but possibly less than twice the intermediate frequency (undersampling) in order to transpose the signal into the baseband by spectrum folding, followed by a stage for shaping said converted signal by decimation filtering.

Other features and advantages of the invention emerge from the following description.

BRIEF DESCRIPTION OF THE DRAWINGS

FIG. 1 is a block diagram of a conventional prior art two-channel receiver.

FIG. 2 is a block diagram of a digital receiver according to the invention;

FIG. 3 is a block diagram of a Sigma-Delta converter.

FIG. 4 shows one example of the power spectral density as a function of frequency characteristic obtained with the method according to the invention.

FIG. 5 shows the noise power spectral density for two different sampling frequencies.

DETAILED DESCRIPTION OF THE PREFERRED EMBODIMENTS

One specific embodiment of a digital receiver according to the invention is now described with reference to FIGS. 2 to 5.

Referring to FIG. 2, the digital receiver 1 according to the invention comprises a receive antenna 11, a bandpass filter 16 followed by a low-noise preamplifier 20 covering the entire bandwidth of the receiver, a mixer 21 followed by a bandpass filter 22 for transposing the signal to a predetermined intermediate frequency, an analog/digital converter module 15 generating a digital signal on one bit followed by two channels 12, 13 in phase quadrature each comprising a decimation filter 9, 10 delivering digital information on n bits and connected to a baseband processing module 14.

The analog/digital converter module 15 can advantageously be a Sigma/Delta converter as described in "Oversampling Delta-Sigma Data Converters" by James C. CANDY and Gabor C. TEMES, IEEE Press. Sigma-Delta converters are analog/digital converters designed to be implemented in integrated circuit form. Referring to FIG. 3, a Sigma-Delta converter 15 typically comprises a filter 3, a sampler 4, a quantizer 5 (a one-bit quantizer, for example) and a loop comprising a digital/analog converter 6, optionally followed by an analog filter, and a subtractor 2 receiving at a positive input the signal to be converted and at a negative input the output signal from the digital/analog converter or the analog filter, if present. The converter 15 is generally followed by one or more decimation filters 16. The sampling frequency must be proportional to the intermediate frequency in order to transpose a component of the sampled signal into the baseband by spectrum folding. The factor of proportionality between the two frequencies must be of the following type:

$$f_{sampling} = \frac{4}{2m+1} \cdot f_{IF}$$

where
$f_{IF}$ is the intermediate frequency, and
m is a predetermined positive integer or zero; this is to transpose a component of the signal into the baseband as described in "Interpolative bandpass A/D Conversion" by Hans-Joachim DRESLER, Signal Processing 22 (1991) pp 139–151. The intermediate frequency $f_{IF}$ and the coefficient m must additionally be chosen so that the sampling frequency is more than twice the bandwidth of the incoming signal (Nyquist frequency), although in practise much higher ratios are used, for example from 20 to 100. This is because the quantizer adds a high level of quantizing noise to the signal, especially in the case of a one-bit quantizer which is no more than a simple comparator, and it is then desirable to increase the sampling frequency in order to reduce the level of quantizing noise in the wanted signal band. If the quantizing noise is assumed to be similar to white noise, the power spectral density due to the quantizer 5 has a characteristic as shown in FIG. 5 in which S represents the spectral density of the signal and B1 represents the spectral density of the white noise for a sampling frequency Fs1. If a sampling frequency Fs2 much greater than the Nyquist frequency is chosen the noise spectral density B2 is spread over a wider band and the wanted signal S is less affected.

The feedback loop 6 helps to reject noise which is out of the signal band by means of a filter 3 preceding the oversampling sampler 4. This conversion method produces baseband power spectral densities as shown in FIG. 4, where the noise spectral density B in the signal band is minimal and increases only beyond this band up to the frequency Fs/2. It is then necessary for practical reasons to reduce the sampling frequency to the Nyquist frequency, or a value slightly greater than this. This can be achieved in the digital domain by means of a decimation filter whose function is to reject out-band noise, any replicas of the spectrum due to spectrum folding and any scrambling manifested by frequencies greater than that of the wanted signal and below the Nyquist frequency, and also to block the sampling frequency. The cut-off frequency of this filter is a compromise in the sense that too high a cut-off frequency provides insufficient protection against interference while too low a cut-off frequency causes signal distortion. The decimation principle used in this type of filter and synthesis modes are described in "Interpolation and Decimation of Digital Signals" by R. E. CROCHIERE and L. R. RABINER, Proceedings of the IEEE, Vol. 69, No. 3, March 1981.

In the case of the digital receiver according to the invention shown in FIG. 2 the analog/digital converter 15 operates on an intermediate frequency signal IF which has passed through a bandpass filter 22. It is particularly advantageous to employ a so-called "undersampling" technique whereby the sampling frequency is not at least twice the maximum frequency signal (the Nyquist frequency) but at least twice the wanted signal bandwidth, which in the case of an intermediate frequency signal entails a considerable reduction in the sampling frequency and therefore an improvement in the performance of the digital receiver. The principle of undersampling used at the sampler 4 is described in "Undersampling techniques simplify digital radio" by Richard CROSHONG and Stephen RUSCAK, "Electronic Design", May 23, 1991 and transposes the intermediate frequency signal into the baseband.

The effects of the method according to the invention on the noise spectrum are now described. Referring to FIG. 4, which shows the spectral power density P(f) of a received signal S, an interference frequency I, a quantizing noise spectrum B for a sampling frequency Fs and a filter F.

Note that the quantizing noise is virtually rejected from the wanted band and can be eliminated by the decimation filters 9, 10 which also contribute to elimination of the interference frequency I. In practise the decimation filters can be very long.

In one effective embodiment of the invention, for a one-bit quantizer frequency of 200 kHz, the decimator filter delivers information on 8 bits at a frequency of 8 kHz, representing a digital bit rate of 64 kbit/s.

Also, using the invention, the digital implementation of the filter allows a very high level of adaptability with the result that the receiver characteristics can be fine-tuned in use and adaptive bit rate problems can be solved.

Of course, the invention is not limited to the examples that have just been described and many modifications can be made to these examples without departing from the scope of the invention. The method according to the invention can provide a satisfactory solution for variable bandwidths and adaptive bit rates in future applications such as RACE and UMTS.

I claim:

1. A digital receiver (1), comprising:

analog converter means (21) for converting an incoming signal to a predetermined intermediate frequency (IF) to produce an intermediate frequency signal;

baseband processing means (14);

analog/digital converter means (15) which receives at an input said intermediate frequency signal and processes said intermediate frequency signal using oversampling relative to a baseband signal bandwidth and undersampling relative to said intermediate frequency, said analog/digital converter means being of the Sigma-Delta type and comprising subtractor means (2), filter means (3) coupled to an output of said subtractor means, sampling means (4) coupled to an output of said filter means, quantizing means (5) coupled to an output of said sampling means, and a feedback loop (6) coupled to an output of said quantizing means and to an input of said subtractor means and incorporating digital/analog converter means; and decimation filter means (9, 10) receiving at an input an output signal of said analog/digital converter means (15) and having an output connected to said baseband processing means (14).

2. Receiver (1) according to claim 1, wherein said decimation filter means comprises two decimation filters, and wherein the receiver further comprises two channels (12, 13) each receiving the output signal of the analog/digital converter means and each comprising one of said decimation filters, respective outputs of which are connected to said baseband processing means (14).

3. Receiver (1) according to claim 1 characterized in that the quantizing means (5) generates output information on one bit.

4. Receiver (1) according to claim 1 characterized in that the feedback loop (6) further comprises analog filter means coupled to an output of said digital/analog converter means and coupled to an input of said subtractor means.

5. Receiver (1) according to claim 1 characterized in that the analog/digital converter means or the decimation filter means is implemented in integrated circuit form.

6. A method for digital filtering in the baseband of an input signal previously converted to a predetermined intermediate frequency used in a receiver comprising: analog converter means (21) for converting the input signal to a predetermined intermediate frequency (IF) to produce an intermediate frequency signal; baseband processing means (14); analog/digital converter means (15) which receives at an input said intermediate frequency signal and processes said intermediate frequency signal using oversampling relative to a baseband signal bandwidth and undersampling relative to said intermediate frequency; and decimation filter means (9, 10) receiving at an input an output signal of said analog/digital converter means (15) and having an output connected to said baseband processing means (14), the method comprising the steps of:

analog/digital converting said intermediate frequency signal to produce a converted signal using a sampling frequency greater than twice the bandwidth of the input signal (oversampling) but less than twice the intermediate frequency (undersampling) in order to transpose the intermediate frequency signal into the baseband by spectrum folding, the converting step including the steps of: digital/analog converting said converted signal to produce a feedback signal; subtracting the feedback signal from the intermediate frequency signal to provide a difference signal; filtering said difference signal; sampling the filtered difference signal; and quantizing the sampled difference signal to produce said converted signal; and shaping said converted signal by decimation filtering.

7. Method according to claim 6 implemented in a two-channel digital receiver characterized in that said shaping step comprises filtering said converted signal in said decimation filter means comprising two parallel decimation filters applied to respective channels (12, 13).

8. Method according to claim 6 characterized in that the decimation filtering is of the adaptive type.

9. The method according to claim 6, further comprising the step of filtering said feedback signal.

* * * * *